(12) United States Patent
Park et al.

(10) Patent No.: US 12,626,733 B2
(45) Date of Patent: May 12, 2026

(54) POWER MANAGEMENT INTEGRATED CIRCUIT AND MEMORY MODULE INCLUDING THE SAME

(71) Applicant: Samsung Electronics Co., Ltd., Suwon-si (KR)

(72) Inventors: Jae Hyun Park, Suwon-si (KR); Dong Woo Baek, Suwon-si (KR); Hyeung Joon Cha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 56 days.

(21) Appl. No.: 18/748,051

(22) Filed: Jun. 19, 2024

(65) Prior Publication Data

US 2025/0166692 A1 May 22, 2025

(30) Foreign Application Priority Data

Nov. 16, 2023 (KR) ........................ 10-2023-0159160

(51) Int. Cl.
 *G11C 5/14* (2006.01)
 *H02H 9/04* (2006.01)
(52) U.S. Cl.
 CPC ............. *G11C 5/143* (2013.01); *H02H 9/043* (2013.01)
(58) Field of Classification Search
 CPC ..... G11C 5/143; G11C 5/147; G11C 11/4078; G11C 11/4074; H02H 9/043; H02H 9/04; H02H 3/20
 See application file for complete search history.

(56) References Cited

U.S. PATENT DOCUMENTS

| | | | |
|---|---|---|---|
| 8,670,219 B2 | 3/2014 | Disney | |
| 10,148,084 B2 | 12/2018 | Forghani-Zadeh et al. | |
| 10,547,170 B2 | 1/2020 | Nakahara et al. | |
| 10,910,820 B2 | 2/2021 | Hanson et al. | |
| 2010/0254051 A1* | 10/2010 | Jeon ....................... | H02H 9/046 |
| | | | 361/56 |
| 2011/0235222 A1* | 9/2011 | Hong ............... | H03K 17/08122 |
| | | | 361/42 |
| 2019/0348801 A1* | 11/2019 | Wu ........................ | H02H 9/044 |
| 2022/0080907 A1 | 3/2022 | Nishikawa et al. | |

FOREIGN PATENT DOCUMENTS

| | | |
|---|---|---|
| JP | 2002-041155 A | 2/2002 |
| JP | 2014-138476 A | 7/2014 |
| JP | 2014-204072 A | 10/2014 |

* cited by examiner

*Primary Examiner* — Jay W. Radke
(74) *Attorney, Agent, or Firm* — Muir Patent Law, PLLC

(57) ABSTRACT

A power management integrated circuit includes an internal output transistor connected to an external voltage input line, to which an external voltage is supplied, and outputting an internal output voltage, a self-overvoltage protection circuit detecting whether the external voltage exceeds a breakdown condition for the internal output transistor and providing a gate voltage to a gate terminal of the internal output transistor and a clamp circuit outputting, as the internal output voltage, a first clamp voltage having a uniform level in a first overvoltage clamp mode and a second clamp voltage, which is leveled down from the external voltage, in a second overvoltage clamp mode. When the internal output transistor is turned off, the clamp circuit outputs the internal output voltage. The external voltage in the second overvoltage clamp mode may be greater than the external voltage in the first overvoltage clamp mode.

20 Claims, 15 Drawing Sheets

| Normal mode | | | | | |
|---|---|---|---|---|---|
| DZ1 | DZ2 | DZ3 | DZ4 | DZ5 | HVMN1 |
| OFF | OFF | OFF | OFF | OFF | ON |
| LVMN1 | LVMN2 | LVMN3 | LVMP1 | LVMP2 | HVMN22 | HVMN21 |
| OFF | OFF | ON | OFF | ON | OFF | OFF |

| OVP sensing mode | | | | | | |
|---|---|---|---|---|---|---|
| DZ1 | DZ2 | DZ3 | DZ4 | DZ5 | HVMN1 | |
| ON | ON | OFF | OFF | OFF | ON | |
| LVMN1 | LVMN2 | LVMN3 | LVMP1 | LVMP2 | HVMN22 | HVMN21 |
| OFF | OFF | ON | OFF | ON | OFF | OFF |

| OVP clamp mode 1 | | | | | |
|---|---|---|---|---|---|
| DZ1 | DZ2 | DZ3 | DZ4 | DZ5 | HVMN1 |
| ON | ON | OFF | ON | OFF | OFF |
| LVMN1 | LVMN2 | LVMN3 | LVMP1 | LVMP2 | HVMN22 | HVMN21 |
| ON | ON | OFF | ON | OFF | ON | ON |

OVP clamp mode 2

| DZ1 | DZ2 | DZ3 | DZ4 | DZ5 | HVMN1 | |
|---|---|---|---|---|---|---|
| ON | ON | ON | ON | ON | OFF | |
| LVMN1 | LVMN2 | LVMN3 | LVMP1 | LVMP2 | HVMN22 | HVMN21 |
| ON | ON | OFF | ON | OFF | ON | ON |

FIG. 14

| | Breakdown Conditions | | |
| --- | --- | --- | --- |
| | Max VGS | Max VDS | Required Breakdown Conditions for Components |
| LVMN1 | VDZ3 | VDZ2 | LVBV > VDZ |
| LVMN2 | VTH | VINLV-2*VDZ | VINLV - 2*VDZ > LVBV |
| LVMN3 | VDZ2 | VDZ3 | LVBV > VDZ |
| LVMP1 | VDZ2-VTH | VDZ1+VTH | LVBV > VDZ +VTH |
| LVMP2 | VDZ1+VTH | VDZ1+VTH | LVBV > VDZ +VTH |
| HVMN1 | VDZ2 | VINLV | HVBV > VINLV |
| HVMN2 | VTH | VINLV-VDZ | HVBV > VINLV-VDZ |

| Resistance Conditions | | |
| --- | --- | --- |
| R0 << R1 + R2 | R5 ≈ R6 | R10 >> R9 ≈ R8 |

FIG. 15

POWER MANAGEMENT INTEGRATED CIRCUIT AND MEMORY MODULE INCLUDING THE SAME

CROSS-REFERENCE TO RELATED APPLICATION(S)

This application claims priority under 35 U.S.C. § 119 to Korean Patent Application No. 10-2023-0159160 filed on Nov. 16, 2023 in the Korean Intellectual Property Office, the disclosure of which is incorporated by reference herein in its entirety.

BACKGROUND

1. Field

The present disclosure relates to a power management integrated circuit (PMIC) for a memory module.

2. Description of the Related Art

Memory modules are powered by at least two external power sources in accordance with standard specifications. For example, the memory modules receive high-voltage power of 12V and low-voltage power of 5V or less, and convert them into internal voltages. In a memory system (e.g., a server module) that includes such memory modules, multiple memory modules are driven at the same time by a single server, so external power generated by the server is designed to drive high currents of tens of amperes (A) or greater. The power supply circuit of the server may have difficulties in applying a system that identifies the status of the parallel-connected memory modules and selectively controls the supplied currents, due to cost, power efficiency, and space constraints.

In particular, there can be instances where a hot plug-short phenomenon occurs between high-voltage and low-voltage pins among the input/output pins of each memory module. A hot plug refers to a situation where memory modules are connected or disconnected while power is supplied during the operation of a server or a data center. In a hot-plug situation, if the connectors with the memory modules are defective or not properly connected, there are defective cables, or there are problems with the power supply device itself or compatibility issues with hardware components, a power short may occur between nodes that should not be electrically connected. This is referred to as a hot-plug short or the hot plug-short phenomenon. The hot plug-short phenomenon may lead to overcurrent, fire, or damage to memory modules and their connected memory system such as a server.

For example, the burning of integrated circuits (ICs), known as 'IC burnt,' may occur due to damage to low-voltage devices connected to low-voltage pins, and the IC burnt of memory modules can be directly linked to fire hazards for the server. Therefore, there is a need for memory modules to have a feature that can protect them from unstable power supply conditions.

SUMMARY

Aspects of the present disclosure provide a memory module with improved durability and reliability, even in unstable power conditions.

Aspects of the present disclosure also provide a power management integrated circuit (PMIC) that protects a memory module from a hot plug-short phenomenon.

Aspects of the present disclosure also provide a memory device that includes a PMIC capable of operating stably while minimizing an increase in its area with the use of low-voltage devices.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a power management integrated circuit including an internal output transistor connected to an external voltage input line, to which an external voltage is supplied, and outputting an internal output voltage, a self-overvoltage protection circuit detecting whether the external voltage exceeds a breakdown condition for the internal output transistor and providing a gate voltage of the internal output transistor and a clamp circuit outputting, as the internal output voltage, a first clamp voltage with a uniform level in a first overvoltage clamp mode and a second clamp voltage, which is leveled down from the external voltage, in a second overvoltage clamp mode. When the internal output transistor is turned off, the clamp circuit may output the internal output voltage. The external voltage in the second overvoltage clamp mode may be greater than the external voltage in the first overvoltage clamp mode.

According to another aspect of the present disclosure, there is provided a power management integrated circuit (PMIC) including an internal output transistor having a source terminal connected to an external voltage input line, to which an external voltage is supplied, and outputting an internal output voltage to a voltage supply terminal of an external device in a normal mode and an overvoltage sensing mode, a self-overvoltage protection circuit turning on the internal output transistor in the overvoltage sensing mode, and turning off the internal output transistor in clamp mode, and a clamp circuit including first and second high-voltage clamp transistors, which are connected to each other via a current mirror, and outputting a clamp voltage as the internal output voltage, which is generated from the second high-voltage clamp transistor, to the external device, in the clamp mode. When the external voltage becomes higher than a first voltage, the self-overvoltage protection circuit turns on the internal output transistor. When the external voltage becomes higher than a second voltage greater than the first voltage, the self-overvoltage protection circuit turns off the internal output transistor.

According to the aforementioned and other embodiments of the present disclosure, a memory module includes memory input/output pins, a plurality of memory devices, and a power management integrated circuit (PMIC). The PMIC receives an external voltage at an external voltage input line through at least one of the memory input/output pins and output an internal output voltage to the plurality of memory devices. The PMIC includes an internal output transistor, which is turned on in a normal mode and an overvoltage sensing mode and provides the internal output voltage, and a clamp circuit, which includes first and second high-voltage clamp transistors connected to each other via a current mirror, and outputs a clamp voltage as the internal output voltage generated from the second high-voltage clamp transistor. When the internal output transistor is turned off, the clamp circuit outputs the clamp voltage from the second high-voltage clamp transistor.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIGS. 2 and 3 are circuit diagrams illustrating a PMIC according to some embodiments of the present disclosure.

FIG. 6 is a table showing the on/off statuses of the transistors and Zener diodes in the PMIC 100 of FIG. 5 according to example embodiments.

FIG. 7 is a circuit diagram illustrating the operation of the PMIC 100 in the overvoltage sensing mode according to example embodiments.

FIG. 8 is a table showing the on/off statuses of the transistors and Zener diodes in the PMIC 100 of FIG. 7 according to example embodiments.

FIG. 10 is a circuit diagram illustrating the operation of the PMIC 100 in the first overvoltage clamp mode according to example embodiments.

FIG. 11 is a table showing the on/off statuses of the transistors and Zener diodes in the PMIC 100 of FIG. 10 according to example embodiments.

FIG. 12 is a circuit diagram illustrating the operation of the PMIC 100 in the second overvoltage clamp mode according to example embodiments.

FIG. 13 is a table showing the on/off statuses of the transistors and Zener diodes in the PMIC 100 of FIG. 12 according to example embodiments.

FIG. 14 shows the minimum required breakdown voltage for each component of the PMIC 100 according to example embodiments.

FIG. 15 illustrates a memory module including the PMIC 100, according to some embodiments of the present disclosure.

DETAILED DESCRIPTION

A memory device according to some embodiments of the present disclosure will hereinafter be described with reference to FIGS. 1 through 15.

Figure 1:
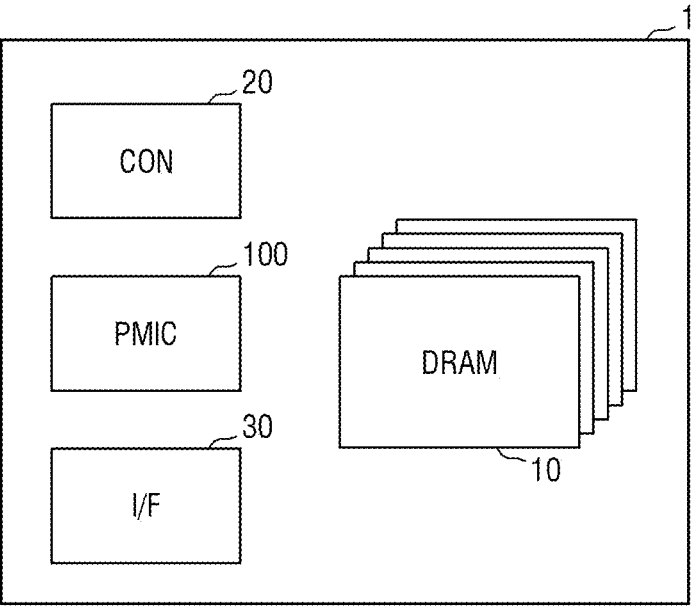
FIG. 1 is a drawing illustrating a memory module according to some embodiments of the present disclosure.

FIG. 1 is a drawing illustrating a memory module according to some embodiments of the present disclosure.

Referring to FIG. 1, a memory module 1 may include memory devices 10, a controller 20, a power management integrated circuit (PMIC) 100, and an input/output interface 30.

For example, the memory devices 10 may be dynamic random-access memory (DRAM) devices, but the present disclosure is not limited thereto. The memory devices 10 may be volatile memory devices such as synchronous DRAMs, double data rate static DRAMs (DDR SRAMs), low power double data Rate static DRAMs (LPDDR SDRAMs), graphics double data rate static-DRAMs (GDDR SDRAMs), DDR2 SDRAMs, DDR3 SDRAMs, DDR4 SDRAMs, DDR5 SDRAMs, wide I/O DRAMs, high band-width memories (HBMs), hybrid memory cubes (HMCs), etc. In some embodiments, the memory devices 10 may be groups of memory devices mounted on the memory module 1. The memory module 1 may be implemented as an unbuffered dual in-line memory module (UDIMM), a reg-istered dual in-line memory module (RDIMM), a load reduced dual in-line memory module (LRDIMM), a fully buffered dual in-line memory module (FBDIMM), a small outline dual in-line memory module (SODIMM), etc. Alter-natively, in some embodiments, the memory devices 10 may be nonvolatile memory devices such as flash memories, phase-change random-access memories (PRAMs), magnetic random-access memories (MRAMs), resistive random-ac-cess memories (RRAMs), ferroelectric random-access memories (FRAMs), etc.

Although not illustrated, the memory module 1 may be connected to a memory controller and operate under the control of the memory controller. For example, the memory controller may control access operations (e.g., a write opera-tion or a read operation) to the memory devices 10 within the memory module 1. The memory controller may be imple-mented with one or more hardware components and/or program codes of software and/or firmware for memory interfacing, such as selecting rows and columns correspond-ing to memory cells, writing data to memory cells, or reading out written data.

The controller 20 may convert signals received through the I/O interface 30 into signals for the memory devices 10 to control data access operations such as writing data, reading out stored data, erasing data, or performing error correction.

The I/O interface 30 may include an interface circuit for communication between the memory devices 10 and the memory controller, and may include, for example, buffer circuits, pins, connectors, traces, etc.

The PMIC 100 performs power management for the memory module 1. The PMIC 100 may convert an external voltage VINLV into an internal output voltage VINLVINT and supply the internal output voltage VINLVINT to the memory devices 10, the controller 20, and the I/O interface 30. For example, the PMIC 100 may be configured to scale up or scale down the external voltage VINLV, provided from outside the memory module 1, and perform direct current-direct current (DC-DC) conversion or another similar power management operation to convert the external voltage VINLV into the internal output voltage VINLVINT. In some embodiments, the PMIC 100 may include DC-DC convert-ers such as low-dropout regulator (LDO) circuits, buck converters, boost converters, or buck-booster converters, power field-effect transistors, pulse-frequency modulation circuits or pulse-width modulation circuits, real-time clock circuits, or any other arbitrary circuitry that can be typically implemented in a PMIC.

Figure 2:
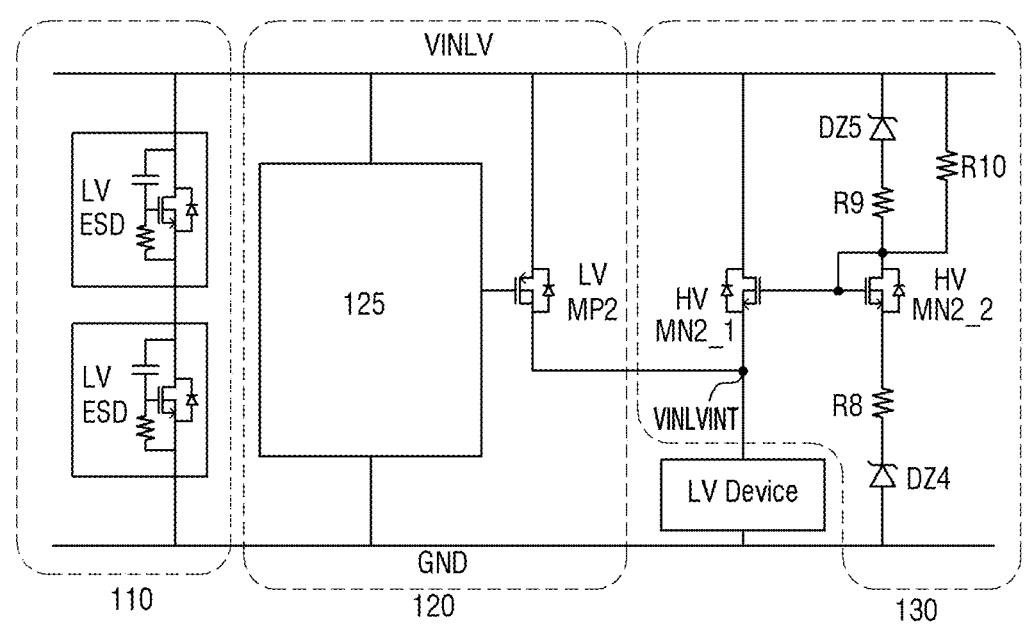
Figure 3:
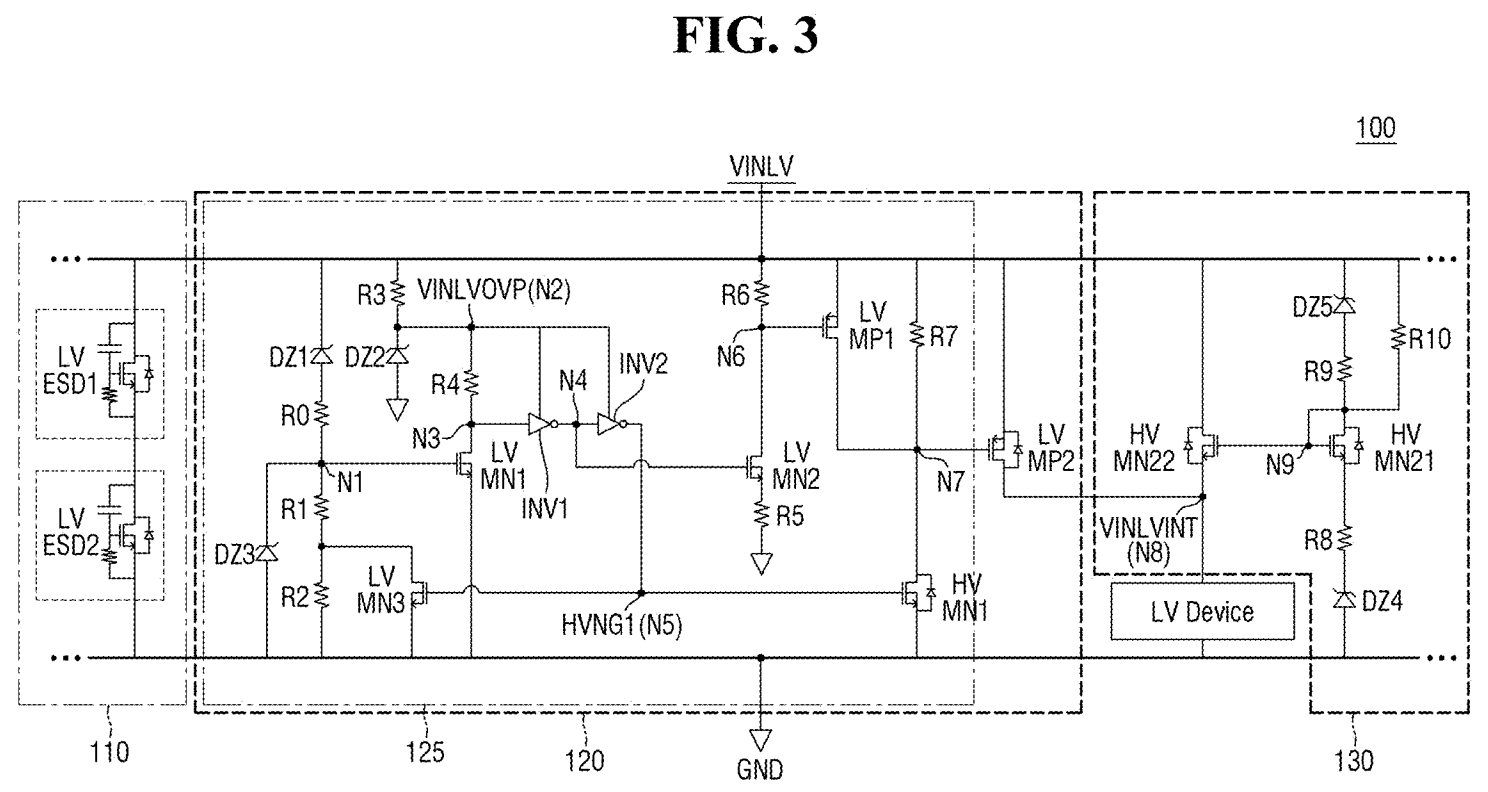

FIGS. 2 and 3 are circuit diagrams illustrating a PMIC according to some embodiments of the present disclosure.

Referring to FIG. 2, in normal mode, the PMIC 100 receives the external voltage VINLV through an external voltage input line for the external voltage VINLV, converts the external voltage VINLV to the internal output voltage VINLVINT, and outputs the internal output voltage VINLVINT. In a case where a high voltage is input to the external voltage input line, other than in normal mode, the PMIC 100 uses a serially connected transistor structure to control the output of the high voltage as an internal supply voltage and thereby prevent the external voltage VINLV from being directly input to the memory devices 10.

The PMIC 100 operates in a normal mode, an overvoltage sensing mode, and an overvoltage clamp mode. The normal mode is a mode where the PMIC 100 is supplied with the external voltage VINLV within a predefined normal power range. The overvoltage sensing mode is a mode where the external voltage exceeds the normal power range and is yet within a voltage range that does not destroy the low-voltage devices (e.g., transistors) included in the PMIC 100. The overvoltage clamp mode is a mode where the external voltage exceeds the normal power range and even reaches a voltage level that can destroy low-voltage devices. Operations of the PMIC 100 in the normal mode, the overvoltage sensing mode, and the overvoltage clamp mode will be described later with reference to FIGS. 4 through 14.

In some embodiments, the PMIC 100 includes an electrostatic discharge (ESD) protection circuit 110, an overvoltage sensing circuit 120, and a clamp circuit 130.

In some embodiments, the ESD protection circuit 110, which is a circuit designed to prevent damage that may be caused by a surge voltage such as static electricity to the memory module 1, may include a low-voltage ESD protection circuit "LV ESD". For example, the ESD protection circuit 110 may be implemented in a stack-connected configuration with a low-voltage ESD protection circuit "LV ESD", between the external voltage input line and a ground voltage line for a ground voltage GND. For example, the ESD protection circuit 110 may stack-connect N low-voltage ESD protection circuits "LV ESD" of the same size (where N is a natural number greater than 1, such as 2) to withstand voltages N times higher than a single low-voltage device without the aid of a high-voltage device.

In some embodiments, the overvoltage sensing circuit 120 includes a self-overvoltage protection circuit 125 and an internal output transistor LVMP2. In a case where the external voltage VINLV is within the normal power range, i.e., in the normal mode, the overvoltage sensing circuit 120 turns on the internal output transistor LVMP2 to output the external voltage VINLV to an eighth node N8 connected to a low-voltage device "LV Device". In example embodiments, the low-voltage device "LV Device" may include at least one of a controller, a memory device, a logic device, an interface device, and a bias circuit. For example, the low-voltage device "LV Device" may be the memory devices 10, the controller 20, or the input/output interface 30 shown in FIG. 1. For example, the low-voltage device "LV Device" may include transistors or components included in the memory devices 10, the controller 20, and/or the input/output interface 30. The logic device or the controller may include a microprocessor, a graphics processor, a signal processor, a network processor, a codec, etc. When an external voltage VINLV exceeding the normal power range is input, the overvoltage sensing circuit 120 operates in the overvoltage sensing mode for the external voltage VINLV within a predetermined range, and operates in the overvoltage clamp mode if the external voltage VINLV further increases.

Referring to FIG. 3, the self-overvoltage protection circuit 125 may include a plurality of low-voltage transistors, one high-voltage transistor, a plurality of Zener diodes, a plurality of resistors, and two inverters. A difference between the low-voltage transistor and the high-voltage transistor may be at least one of source/drain concentration thereof, a distance between source and drain thereof, a breakdown voltage of p-n junction thereof, and a thickness of gate oxide thereof.

For example, the self-overvoltage protection circuit 125 includes a first Zener diode DZ1 and first, second, and third resistors R0, R1, and R2, which are connected in series between the external voltage input line and the ground voltage line. For convenience of explanation, a common node of the first and second resistors R0 and R1 will hereinafter be referred to as a first sensing node (or first node) N1.

The self-overvoltage protection circuit 125 further includes a fourth resistor R3 and a second Zener diode DZ2 between the external voltage input line and the ground voltage line. The fourth resistor R3 and the second Zener diode DZ2 generate a sensed external voltage VINLVOVP from the external voltage input line. The common node of the fourth resistor R3 and the second Zener diode DZ2 will hereinafter be referred to as a second node or sensed external voltage node N2.

The self-overvoltage protection circuit 125 further includes a third Zener diode DZ3 which is connected between the first node N1 and the ground voltage line.

The self-overvoltage protection circuit 125 further includes a fifth resistor R4 and a first low-voltage transistor LVMN1, which are connected in series between the sensed external voltage node N2 and the ground voltage line. The gate terminal of the first low-voltage transistor LVMN1 is connected to the first sensing node N1. For convenience of explanation, the common node of the first low-voltage transistor LVMN1 and the fifth resistor R4 will hereinafter be referred to as a buffer input node or third node N3.

The self-overvoltage protection circuit 125 further includes two inverters, i.e., first and second inverters INV1 and INV2 connected in series to the third node N3. The first inverter INV1 inverts a signal from the third node N3 and outputs the inverted signal to a fourth node N4, and the second inverter INV2 inverts a signal from the fourth node N4 and outputs the inverted signal to a fifth node N5. The first and second inverter INV1 and INV2 are applied the sensed external voltage VINLVOVP from the second node N2.

The self-overvoltage protection circuit 125 further includes a seventh resistor R6, a second low-voltage transistor LVMN2, and a sixth resistor R5, which are connected in series between the external voltage input line and the ground voltage line. The gate terminal of the second low-voltage transistor LVMN2 is connected to the fourth node N4. The common node of the seventh resistor R6 and the second low-voltage transistor LVMN2 will hereinafter be referred to as a sixth node N6.

The self-overvoltage protection circuit 125 further includes a third low-voltage transistor LVMN3, which is connected between a ground volage line and a common node of the second and third resistors R1 and R2. The gate terminal of the third low-voltage transistor LVMN3 is connected to the fifth node N5.

The self-overvoltage protection circuit 125 may further include an eighth resistor R7 and a high-voltage sensing transistor HVMN1, which are connected in series between the external voltage input line and the ground voltage line. The gate terminal of the high-voltage sensing transistor HVMN1 is connected to the fifth node N5. A common node of the eighth resistor R7 and the high-voltage sensing transistor HVMN1 will hereinafter be referred to as a seventh node N7.

The self-overvoltage protection circuit 125 may also include a fourth low-voltage transistor LVMP1, which is connected between the external voltage input line and the seventh node N7 and has a gate terminal connected to the sixth node N6.

The internal output transistor LVMP2 is connected between the external voltage input line and the low-voltage device "LV Device" and has a gate terminal connected to the seventh node N7 to provide the internal output voltage VINLVINT to the low-voltage device "LV Device" through its drain terminal.

In some embodiments, the fourth low-voltage transistor LVMP1 may be a P-type power transistor with the same breakdown characteristics as the internal output transistor LVMP2. In some embodiments, the first, second, and third low-voltage transistors LVMN1, LVMN2, and LVMN3 may be N-type power transistors with the same breakdown characteristics.

The term "breakdown characteristics" refers to the internal output transistor LVMP2 having the same rated voltage as the first, second, and third low-voltage transistors LVMN1, LVMN2, and LVMN3 and having a higher rated current than the first, second, and third low-voltage transistors LVMN1, LVMN2, and LVMN3. For this purpose, the internal output transistor LVMP2 may be implemented in a form where a plurality of unit transistors are connected. For example, the internal output transistor LVMP2 may include a plurality of unit transistors connected to each other in parallel.

In some embodiments, the clamp circuit 130 may include a first high-voltage clamp transistor HVMN21, a second high-voltage clamp transistor HVMN22, a ninth resistor R8, a tenth resistor R9, a fourth Zener diode DZ4, and a fifth Zener diode DZ5.

For example, the clamp circuit 130 may include the second high-voltage clamp transistor HVMN22 connected to the low-voltage device "LV Device", which are connected in series between the external voltage input line and the ground voltage line. The low-voltage device "LV Device" receives the internal output voltage VINLVINT through the drain terminal of the internal output transistor LVMP2. For convenience of explanation, the common node of the second high-voltage clamp transistor HVMN22 and the low-voltage device "LV Device", to which the internal output voltage VINLVINT is applied, will hereinafter be referred to as the eighth node N8.

The clamp circuit 130 may further include the fifth Zener diode DZ5, the tenth resistor R9, the first high-voltage clamp transistor HVMN21, the ninth resistor R8, and the fourth Zener diode DZ4, which are connected in series between the external voltage input line and the ground voltage line. The gate and drain terminals of the first high-voltage clamp transistor HVMN21 are connected to a ninth node N9, and the ninth node N9 is connected to the gate terminal of the second high-voltage clamp transistor HVMN22.

The clamp circuit 130 may further include an eleventh resistor R10, which is connected between the external voltage input line and the ninth node N9.

In some embodiments, the first and second high-voltage clamp transistors HVMN21 and HVMN22 may be N-type high-voltage power transistors with the same breakdown voltages as the internal output transistor LVMP2, and the rated voltage of the first and second high-voltage clamp transistors HVMN21 and HVMN22 may be the same as the rated voltage of the internal output transistor LVMP2. The first and second high-voltage clamp transistors HVMN21 and HVMN22, like the internal output transistor LVMP2, may be implemented in a form where a plurality of unit transistors are connected. For example, each of the first and second high-voltage clamp transistors HVMN21 and HVMN22 may include a plurality of unit transistors connected to each other in parallel.

When the external voltage VINLV exceeds the normal power range and is high enough to destroy low-voltage devices (e.g., transistors), the first and second high-voltage clamp transistors HVMN21 and HVMN22 are turned on through the ninth node N9, acting as switches in a source follower structure. Since the first and second high-voltage clamp transistors HVMN21 and HVMN22 have breakdown characteristics for high voltages, the first and second high-voltage clamp transistors HVMN21 and HVMN22 can protect the circuitry within the PMIC 100 and the low-voltage device "LV Device".

Figure 4:
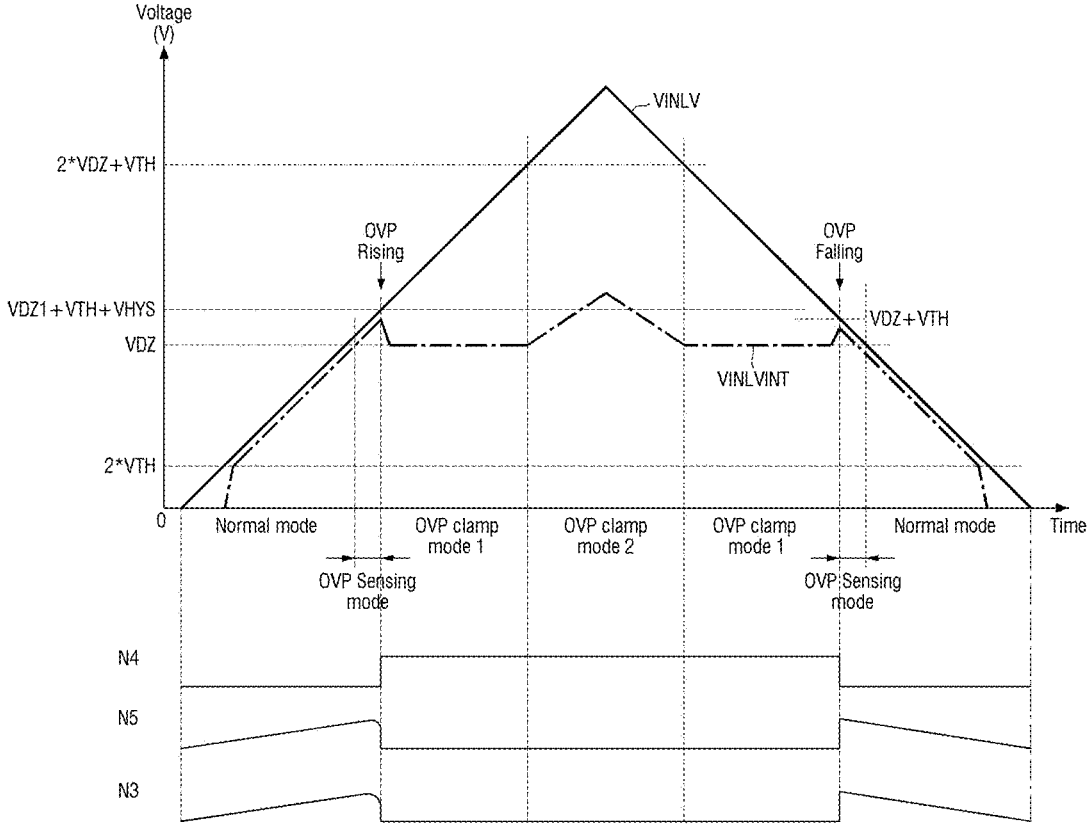
FIG. 4 is a time-voltage graph showing the external voltage input to the PMIC 100 and the internal voltage output from the PMIC 100 according to example embodiments.

FIG. 4 is a time-voltage graph showing the external voltage input to the PMIC 100 and the internal voltage output from the PMIC 100 according to example embodiments.

Referring to FIG. 4, the PMIC 100 operates in a normal mode "Normal mode", an overvoltage sensing mode "OVP sensing mode", and an overvoltage clamp mode. The overvoltage clamp mode may include a first overvoltage clamp mode "OVP clamp mode 1" and a second overvoltage clamp mode "OVP clamp mode 2".

In the normal mode "Normal mode", the PMIC 100 is supplied with an external voltage VINLV within the normal power range, which is defined based on the characteristics of the low-voltage device "LV Device" and other devices included in the PMIC 100. In the normal mode "Normal mode", the PMIC 100 generates and outputs an internal output voltage VINLVINT proportional to the external voltage VINLV. As shown in FIG. 4, the PMIC 100 operates in the normal mode "Normal mode" when the external voltage VINLV is within the range of 0 to a Zener voltage VDZ. The Zener voltage VDZ may be the turn-on threshold voltage of each of the first to fifth Zener diodes DZ1 to DZ5. For example, each of first to fifth Zener voltages VDZ1 to VDZ5 of the first to fifth Zener diodes DZ1 to DZ5 may have the same voltage level. Herein, each of first to fifth Zener voltages VDZ1 to VDZ5 may be collectively referred to as the Zener voltage VDZ.

The PMIC 100 operates in the overvoltage sensing mode "OVP sensing mode" when the external voltage VINLV exceeds the normal power range and yet remains within the voltage range that does not destroy the low-voltage devices (e.g., transistors) included in PMIC 100. In the overvoltage sensing mode "OVP sensing mode", the PMIC 100 generates and outputs an internal output voltage VINLVINT proportional to the external voltage VINLV. As shown in FIG. 4, the PMIC 100 operates in the overvoltage sensing mode "OVP sensing mode" when the external voltage VINLV exceeds the voltage VDZ but is lower than the level of (VDZ+VTH+VHYS). Hereinafter, the voltage VTH may be a threshold voltage corresponding to each of the first to third low-voltage transistors LVMN1 to LVMN3, the high-voltage transistor HVMN1, and the high-voltage clamp transistors HVMN21, and HVMN22.

The PMIC 100 operates in the overvoltage sensing mode "OVP sensing mode" when the external voltage VINLV exceeds the normal power range and reaches a level that can destroy low-voltage transistors in devices. For example, the PMIC 100 operates in the first overvoltage clamp mode "OVP clamp mode 1" when the external voltage VINLV is between (VDZ+VTH+VHYS) and (2VDZ+VTH), and in the second overvoltage clamp mode "OVP clamp mode 2" when the external voltage VINLV exceeds (2VDZ+VTH). In the first overvoltage clamp mode "OVP clamp mode 1", the PMIC 100 controls the internal output voltage VINLVINT to maintain a constant level (for example, the level of the voltage VDZ), regardless of a continued rise in the external voltage VINLV. For example, the PMIC 100 outputs a first clamp voltage with a uniform level as the internal output voltage VINLVINT in the first overvoltage clamp mode "OVP clamp mode 1". If the external voltage VINLV continues to rise in the second overvoltage clamp mode "OVP clamp mode 2", the PMIC 100 generates and outputs an internal output voltage VINLVINT that is proportional to the external voltage VINLV but less than the external voltage VINLV. For example, the PMIC 100 outputs a second clamp voltage, which is leveled down from the external voltage VINLV, as the internal output voltage VINLVINT in the second overvoltage clamp mode "OVP clamp mode 2".

The operations of the PMIC 100 in the normal mode, the overvoltage sensing mode, and the first and second overvoltage clamp modes will hereinafter be described with reference to FIGS. 5 through 14.

Figure 5:
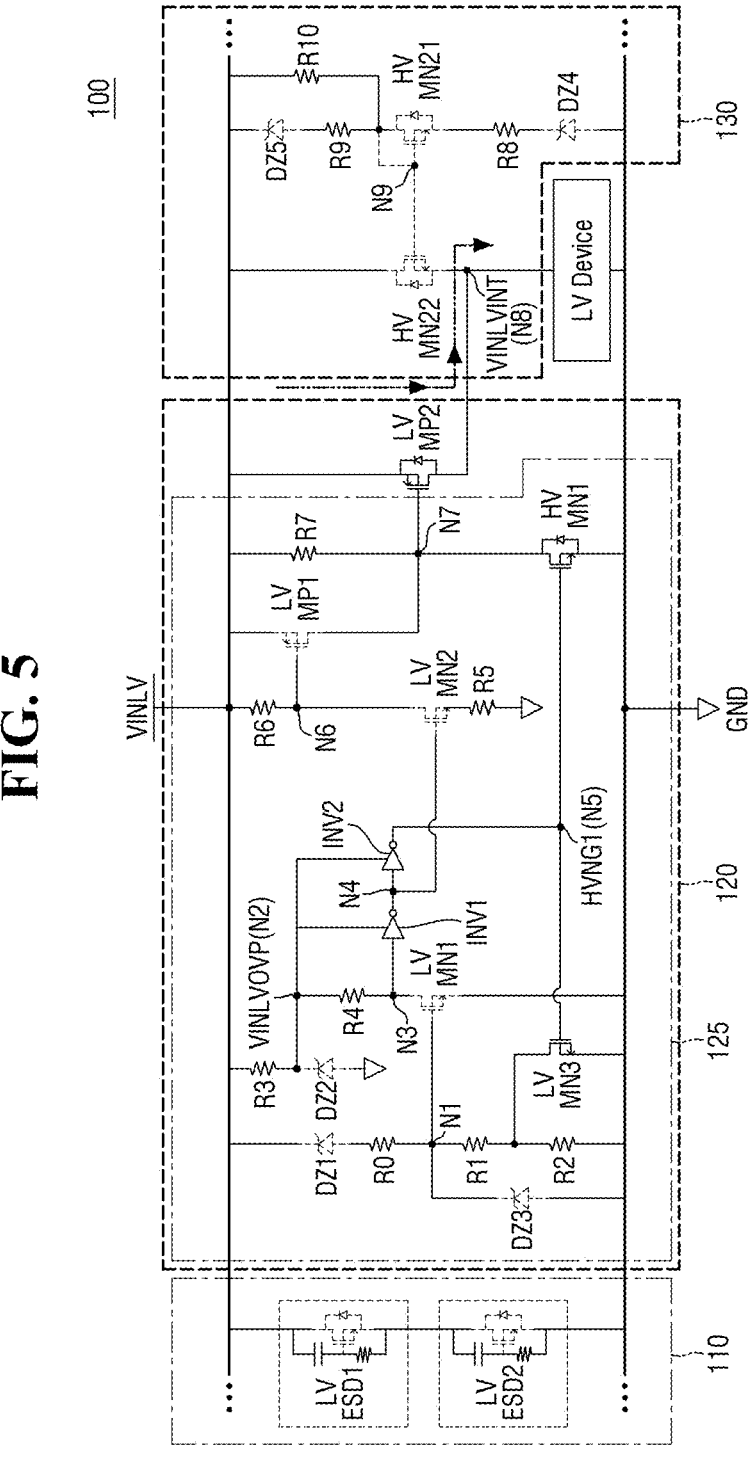
FIG. 5 is a circuit diagram illustrating the operation of the PMIC 100 in the normal mode according to example embodiments.

FIGS. 5 and 6 illustrate the PMIC 100 in the normal mode according to some embodiments of the present disclosure. FIG. 5 is a circuit diagram illustrating the operation of the PMIC 100 in the normal mode, and FIG. 6 is a table showing the on/off statuses of the transistors and Zener diodes in the PMIC 100 of FIG. 5.

Referring to FIGS. 5 and 6, if the external voltage VINLV input to the PMIC 100 is lower than the first Zener voltage VDZ1 of the first Zener diode DZ1 (i.e., VINLV<VDZ1), the PMIC 100 operates in the normal mode, and the self-overvoltage protection circuit 125 is deactivated.

For example, the first Zener diode DZ1, connected to the external voltage input line and the second Zener diode DZ2 connected to the external voltage input line through fourth resistor R3, which are turned off, deactivating the self-overvoltage protection circuit 125. Consequently, the first node N1 becomes logic low, maintaining the first low-voltage transistor LVMN1 to be turned off. The external voltage VINLV is applied to the second node N2 through the fourth resistor R3 as the sensed external voltage VINLVOVP, and as a result, the second node N2 operates as an internal logic power source. The second node N2 is defined as logic high as the internal logic power source. Since the sensed external voltage VINLVOVP at the second node N2 is applied to the third node N3 through the fifth resistor R4 while the first low-voltage transistor LVMN1 is turned off, the third node N3 also becomes logic high. As logic high of the third node N3 is inverted, the fourth node N4 becomes logic low, turning off the second low-voltage transistor LVMN2, and as logic low of the fourth node N4 is inverted, the fifth node N5 becomes logic high, turning on the third low-voltage transistor LVMN3 and the high-voltage sensing transistor HVMN1.

As the external voltage VINLV is applied, the sixth node N6 becomes logic high, turning off the fourth low-voltage transistor LVMP1, and the seventh node N7 becomes logic low, turning on the internal output transistor LVMP2.

As the ground voltage GND is applied in a forward direction, the fourth Zener diode DZ4 is turned off, and as an external voltage VINLV in the normal power range less than the fifth Zener voltage VDZ5 is applied, the fifth Zener diode DZ5 is also turned off. The ninth node N9 is supplied with the external voltage VINLV through the eleventh resistor R10. The gate and drain terminals of the first high-voltage clamp transistor HVMN21 are both connected to the ninth node N9, and as the fourth Zener diode DZ4 is turned off, the first high-voltage clamp transistor HVMN21 is turned off. As the external voltage VINLV is applied to the ninth node N9 and a voltage of the same level as the external voltage VINLV is applied to the eighth node N8 in the normal mode, the second high-voltage clamp transistor HVMN22 is also turned off.

Since the normal mode is not an environment affecting the breakdown of devices or components, the operations of the overvoltage sensing circuit 120 and clamp circuit 130 that are related to the breakdown of components are not performed, and the internal output transistor LVMP2 is turned on and operates. For example, the first, second, third, fourth, and fifth Zener diodes DZ1, DZ2, DZ3, DZ4, and DZ5, the first, second, and fourth low-voltage transistors LVMN1, LVMN2, and LVMP1, and the first and second high-voltage clamp transistors HVMN21 and HVMN22 are turned off, while the high-voltage sensing transistor HVMN1, the third low-voltage transistor LVMN3, and the internal output transistor LVMP2 are turned on. Due to the turned-on or turned-off Zener diodes and transistors, a current in the PMIC flows from the external voltage input line to the low-voltage device "LV Device" through the internal output transistor LVMP2, as indicated by arrows in FIG. 5. Referring also to FIG. 4, in the normal mode, the internal output voltage VINLVINT for the low-voltage device "LV Device" in the PMIC 100 rises along with the external voltage VINLV.

Figure 7:
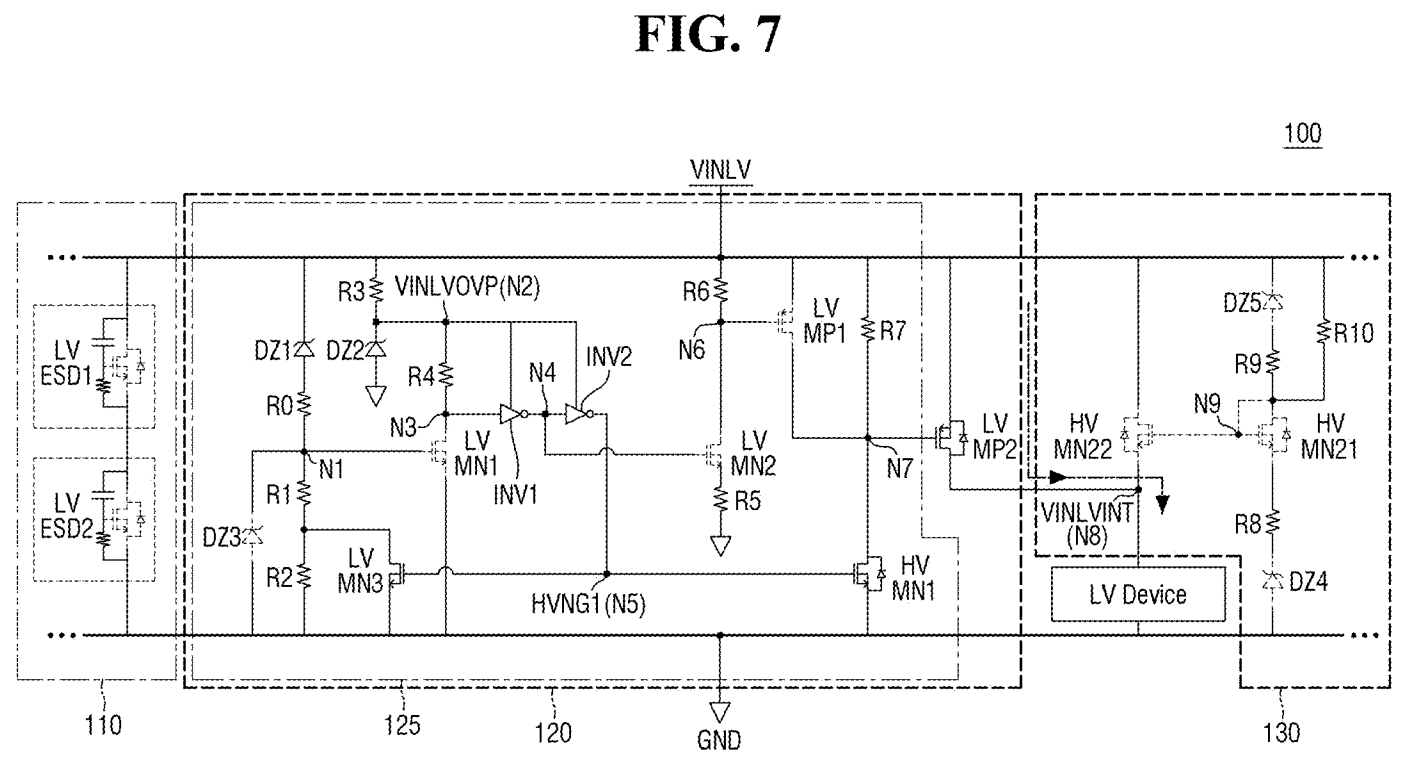
Figure 9:
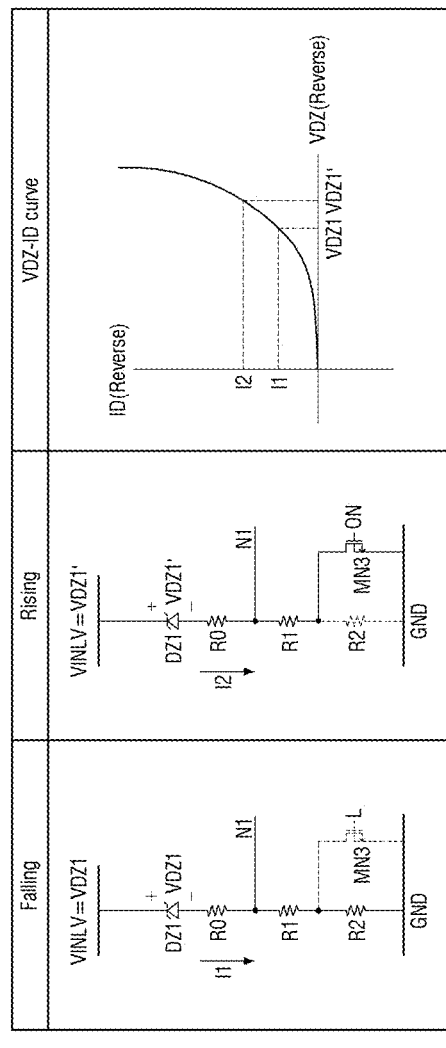
FIG. 9 is a table showing the characteristics of the transistors and resistors included in the PMIC 100 according to example embodiments.

FIGS. 7 and 8 illustrate the PMIC 100 in the overvoltage sensing mode according to some embodiments of the present disclosure. FIG. 7 is a circuit diagram illustrating the operation of the PMIC 100 in the overvoltage sensing mode, and FIG. 8 is a table showing the on/off statuses of the transistors and Zener diodes in the PMIC 100 of FIG. 7. FIG. 9 is a table showing the characteristics of the transistors and resistors included in the PMIC 100 according to example embodiments.

Referring to FIGS. 7 through 9, if the external voltage VINLV input to the PMIC 100 increases and becomes higher than the first Zener voltage VDZ1 of the first Zener diode DZ1 (i.e., VINLV>VDZ1), the PMIC 100 operates in the overvoltage sensing mode, and the overvoltage sensing circuit 120 is activated. However, if the external voltage VINLV is below a critical level that can destroy low-voltage transistors included in a device, the first and second high-voltage clamp transistors HVMN21 and HVMN22 in the clamp circuit 130 are turned off.

For example, the first Zener diode DZ1 connected to the external voltage input line and the second Zener diode DZ2 connected to the external voltage input line through fourth resistor R3, which are turned on, activating the self-overvoltage protection circuit 125.

A switching voltage (or hysteresis voltage) VHYS of the first low-voltage transistor LVMN1 is based on the second and third resistors R1 and R2. For example, referring to the voltage-current graph "VDZ-ID Curve" of FIG. 9, when the external voltage VINLV increases and reaches a reverse first Zener voltage VDZ1 of the first Zener diode DZ1 (i.e., VINLV=VDZ1), the first Zener diode DZ1 is turned on, and a current I1 flows through the first, second, and third resistors R0, R1, and R2. Accordingly, the current I1 is applied to the first node N1, but a voltage $V_{N1}$ at the first node N1 does not reach the threshold voltage (i.e., VDZ1+ VTH) of the first low-voltage transistor LVMN1 (i.e., $V_{N1}$<VDZ1+VTH). Thus, the first low-voltage transistor LVMN1 remains off state. Conversely, if the external voltage VINLV continues to increase and exceeds the reverse first Zener voltage VDZ1 of the first Zener diode DZ1 (i.e., VINLV=VDZ1'), the first Zener diode DZ1 is turned on, and the third low-voltage transistor LVMN3 is also turned on, so that a current I2 flows through the first and second resistors R0 and R1 and the third low-voltage transistor LVMN3. The resistance of the third low-voltage transistor LVMN3 is much less than the resistance of the third resistor R2. Due to the difference between the combined resistances of (R0+R1+R2) and (R0+R1), the current I2 is greater than current I1 (I2>I1). The voltage at the first node N1 is lower in a case "Rising" where the current I2 flows through the first and second resistors R0 and R1 than in a case "Falling" where the current I1 flows through the first, second, and third resistors R0, R1, and R2.

As the external voltage VINLV is applied to the second node N2 through a clamp circuit, consisting of the fourth resistor R3 and the second Zener diode DZ2, as the sensed external voltage VINLVOVP, the operating power for an overvoltage protection circuit is defined as the reverse turn-on voltage of the second Zener diode DZ2. Since the sensed external voltage VINLVOVP from the second node N2 is applied to the third node N3, the third node N3 also becomes logic high. Since logic level of the fourth node N4 is inverted by the first inverter INV1 to become logic low, the second low-voltage transistor LVMN2 is turned off. Due to the inversion of the fourth node N4 by the second inverter INV2, the fifth node N5 becomes logic high, turning on the third low-voltage transistor LVMN3 and the high-voltage sensing transistor HVMN1. However, the third Zener diode DZ3, connected to the first node N1, is turned off, even though the current I1 is applied, because an operating voltage of the third Zener diode DZ3 is lower than the third Zener voltage VDZ3.

Due to the application of the external voltage VINLV, the sixth node N6 becomes logic high, turning off the fourth low-voltage transistor LVMP1, and the seventh node N7 becomes logic low, turning on the internal output transistor LVMP2.

For example, the third, fourth, and fifth Zener diodes DZ3, DZ4, and DZ5, the first, second, and fourth low-voltage transistors LVMN1, LVMN2, and LVMP1, and the first and second high-voltage clamp transistors HVMN21 and HVMN22 are turned off, and the first and second Zener diodes DZ1 and DZ2, the high-voltage sensing transistor HVMN1, the third low-voltage transistor LVMN3, and the internal output transistor LVMP2 are turned on. Due to these turned-on or turned-off Zener diodes and transistors, a current of the PMIC 100 flows from the external voltage input line to the low-voltage device "LV Device" through the internal output transistor LVMP2, as indicated by arrows in FIG. 7.

For example, in the overvoltage sensing mode, as the first and second Zener diodes DZ1 and DZ2 are turned on, the PMIC 100 starts applying a current to the first and second nodes N1 and N2. However, since the first node N1 does not reach the threshold voltage of (VDZ1+VTH+VHYS), logic signals based on the third and fourth nodes N3 and N4 fulfill the same conditions as in the normal mode, turning off the first and second low-voltage transistors LVMN1 and LVMN2 in the self-overvoltage protection circuit 125.

In the overvoltage sensing mode of FIG. 4, the internal output voltage VINLVINT of the PMIC 100 continues to increase even after the external voltage VINLV exceeds the voltage VDZ. Then, when the internal output voltage VINLVINT reaches the turn-on voltage of the first low-voltage transistor LVMN1 (i.e., VDZ1+VTH+VHYS), the first low-voltage transistor LVMN1 is turned on, so that the third node N3 becomes logic low, which in turn makes the fourth node N4 logic high and the fifth node N5 logic low. Consequently, when the external voltage VINLV reaches the turn-on voltage level of the first low-voltage transistor LVMN1, the second low-voltage transistor LVMN2 and the fourth low-voltage transistor LVMP1 are turned on, and the third low-voltage transistor LVMN3 and the high-voltage sensing transistor HVMN1 are turned off. Since the high-voltage sensing transistor HVMN1 is off, the seventh node N7 is supplied with the external voltage VINLV through the eighth resistor R7, and as a result, the internal output transistor LVMP2 is turned off, cutting off the power supplied by the external voltage VINLV. By adjusting a voltage change ΔVDZ (=VDZ1–VDZ2) across the first Zener diode DZ1 using the on/off statuses of the third low-voltage transistor LVMN3 and the second and third resistors R1 and R2, a rising/falling hysteresis voltage (Rising/Falling VHYS) which provided to the gate terminal of the first low-voltage transistor LVMN1 can be adjusted.

Figure 10:
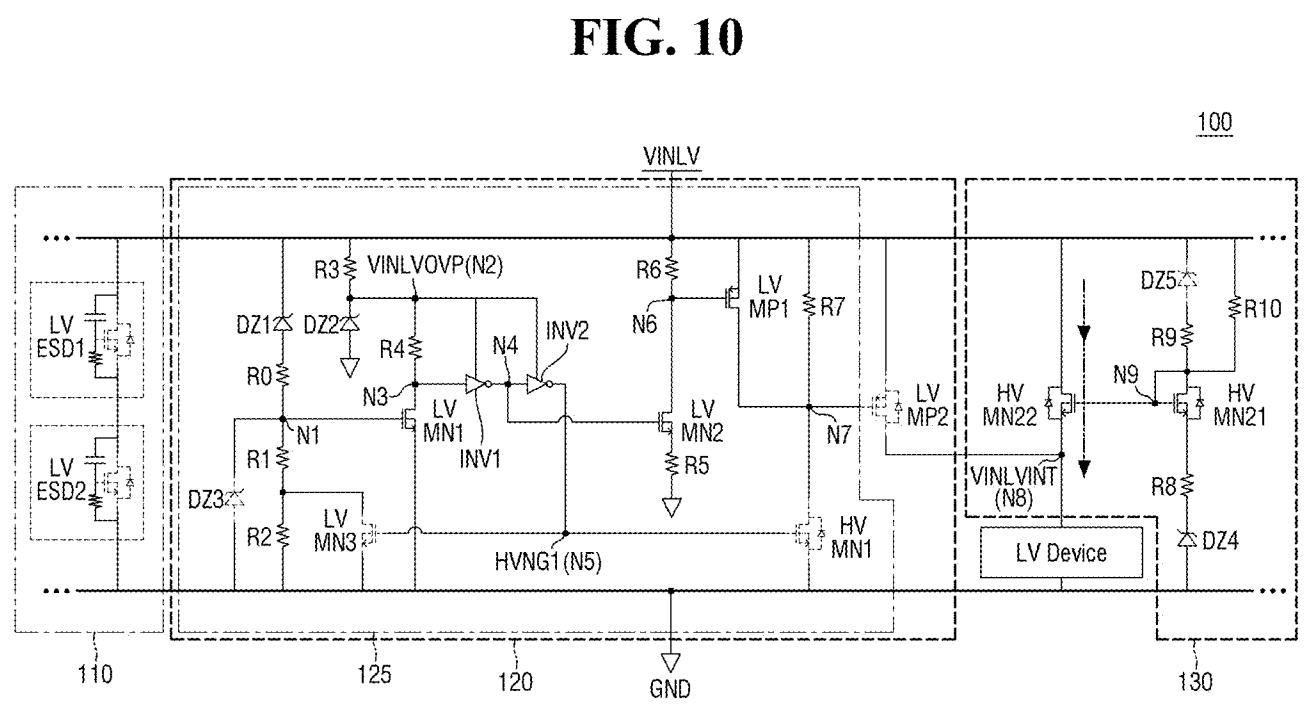

FIGS. 10 and 11 illustrate the PMIC 100 in the first overvoltage clamp mode according to some embodiments of the present disclosure. FIG. 10 is a circuit diagram illustrating the operation of the PMIC 100 in the first overvoltage clamp mode. FIG. 11 is a table showing the on/off statuses of the transistors and Zener diodes in the PMIC 100 of FIG. 10.

Referring to FIGS. 10 and 11 and further to FIG. 4, as the external voltage VINLV continues to increase, exceeding the normal power range and reaching a level that can destroy low-voltage transistors includes in a device, the PMIC 100 operates in the overvoltage clamp mode ("OVP clamp mode 1" and "OVP clamp mode 2"). For example, the PMIC 100 operates in the first overvoltage clamp mode "OVP clamp mode 1" when the external voltage VINLV exceeds a first clamp range, which is the range of voltages, for example, from (VDZ1+VTH+VHYS) to (2VDZ+VTH)), at which the first low-voltage transistor LVMN1 is turned on. In the overvoltage clamp mode ("OVP clamp mode 1" and "OVP clamp mode 2"), the external voltage VINLV is cut off, and power is supplied to the low-voltage device "LV Device" based on clamp power.

Referring to FIGS. 10 and 11, when the external voltage VINLV is within the first clamp range, i.e., when (VDZ1+VTH+VHYS)<VINLV≤(2VDZ4+VTH), the overvoltage sensing circuit 120 and the clamp circuit 130 are both activated and operational.

For example, as the external voltage VINLV, input to the PMIC 100, increases and exceeds the first Zener voltage VDZ1 of the first Zener diode DZ1 (i.e., VINLV>VDZ1) connected to the external voltage input line, the first and second Zener diodes DZ1 and DZ2 are turned on. The first low-voltage transistor LVMN1 receives, via the first node N1, a voltage signal obtained by dividing the voltage obtained by subtracting the first Zener voltage VDZ1 from the external voltage VINLV, via the first, second, and third resistors R0, R1, and R2. The resistances of the first, second, and third resistors R0, R1, and R2 satisfy the following equation: R0<<R1+R2, which ensures that most of the change in the external voltage VINLV is applied to the first node N1. The self-overvoltage protection circuit 125 also includes the third Zener diode DZ3, which is connected between the first node N1 and the ground voltage line. The third Zener diode DZ3 is turned off within the first clamp range, allowing the first low-voltage transistor LVMN1 to operate stably within its breakdown condition.

When the second Zener diode DZ2 is turned on, the sensed external voltage VINLVOVP at the second node N2 is consistently clamped to the voltage VDZ2 of the second Zener diode DZ2. As a result, even if a high voltage is applied to the external voltage input line, the low-voltage device "LV Device" operates stably at the clamp voltage of the second Zener diode DZ2. If the condition for the first clamp range, i.e., VDZ1+VTH+VHYS<VINLV, is met, the first node N1 secures the threshold voltage VTH of the first low-voltage transistor LVMN1, and the first low-voltage transistor LVMN1 is turned on, so that the third node N3 becomes logic low. Consequently, the fourth node N4 becomes logic high due to the inversion of the level of the third node N3 by the first inverter INV1, and the fifth node N5 becomes logic low due to the inversion of the level of the fourth node N4 by the second inverter INV2. Therefore, the second low-voltage transistor LVMN2 is turned on, and the third low-voltage transistor LVMN3 and the high-voltage sensing transistor HVMN1 are turned off. The fourth low-voltage transistor LVMP1 is turned on as the external voltage VINLV within the first clamp range is applied to the sixth node N6, and the internal output transistor LVMP2 is turned off as the seventh node N7 becomes logic high due to the fourth low-voltage transistor LVMP1.

The first and second high-voltage clamp transistors HVMN21 and HVMN22 operate as switches to supply the internal output voltage VINLVINT within the first clamp range. For example, as the internal output transistor LVMP2 is turned off, the supply of the external voltage VINLV is cut off, the level of the internal output voltage VINLVINT drops, and the second high-voltage clamp transistor HVMN22 is turned on when a gate-source voltage VGS of the second high-voltage clamp transistor HVMN22 is secured. Accordingly, the second high-voltage clamp transistor HVMN22 operates as a source-follower regulator, generating the internal output voltage VINLVINT. If the resistance of the eleventh resistor R10 is set to be much greater than the resistance of the ninth resistor R8 (i.e., R10>>R8), then most of the voltage is applied to the eleventh resistor R10. Thus, a voltage at the ninth node N9 is maintained at a constant level of, for example, (VDZ4+VTH), as shown in FIG. 4. The source voltage of the second high-voltage clamp transistor HVMN22 approximates the clamp voltage VDZ4 obtained by subtracting the threshold voltage VTH. Consequently, the internal output voltage VINLVINT of FIG. 4 is uniformly maintained at the level of the clamp voltage VDZ4 of the fourth Zener diode DZ4 through the operation of the second high-voltage clamp transistor HVMN22.

For example, in the PMIC 100, as the external voltage VINLV increases, the second low-voltage transistor LVMN2 is turned on or off, which in turn causes the fourth low-voltage transistor LVMP1 to be turned on or off. Subsequently, the internal output transistor LVMP2 is turned off or on depending on the turned-off or turned-on of the high-voltage sensing transistor HVMN1. As a result, the low-voltage device "LV Device" may either receive the external voltage VINLV through the internal output transistor LVMP2 or receive a clamp voltage with a uniform level through the high-voltage clamp transistor HVMN22.

Figure 12:
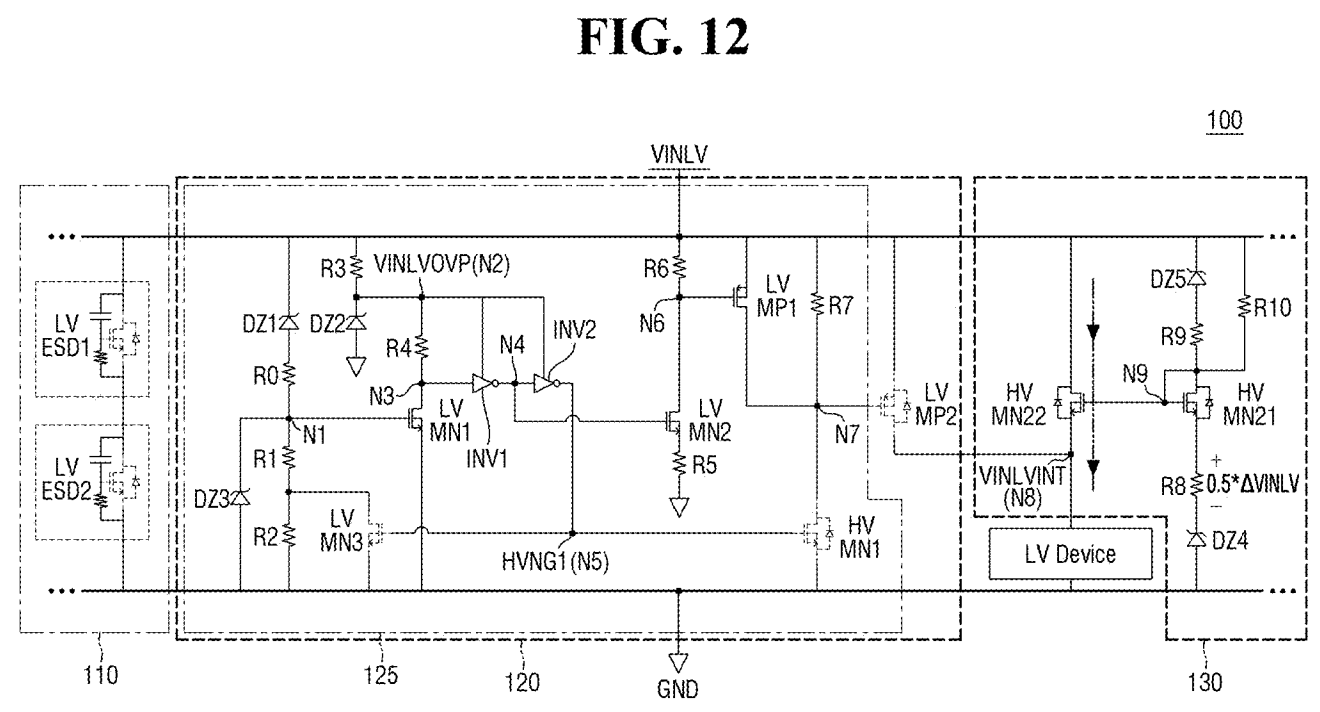

FIGS. 12 and 13 illustrate the PMIC 100 in the second overvoltage clamp mode according to some embodiments of the present disclosure. FIG. 12 is a circuit diagram illustrating the operation of the PMIC 100 in the second overvoltage clamp mode, and FIG. 13 is a table showing the on/off statuses of the transistors and Zener diodes in the PMIC 100 of FIG. 12.

Referring to FIG. 4, as the external voltage VINLV continues to increase beyond the normal power range and reaches the level of (2VDZ+VTH) exceeding the breakdown voltage of the Zener diodes, i.e., VINLV>(2VDZ+VTH), the PMIC 100 operates in the second overvoltage clamp mode "OVP Clamp mode 2". Even in the second overvoltage clamp mode "OVP Clamp mode 2", like in the first overvoltage clamp mode "OVP Clamp mode 1", the supply of the external voltage VINLV is cut off, and power is supplied to the low-voltage device "LV Device" based on the clamp power. However, in the second overvoltage clamp mode "OVP Clamp mode 2", unlike in the first overvoltage clamp mode "OVP Clamp mode 1", the clamp power is increased based on the change in the external voltage VINLV.

For example, referring to FIGS. 12 and 13, when the external voltage VINLV is within a second clamp range, i.e., VINLV>(2VDZ+VTH), the first, second, third, fourth, and fifth Zener diodes DZ1, DZ2, DZ3, DZ4, and DZ5 are turned on.

As the external voltage VINLV increases and exceeds the reverse first Zener voltage VDZ1 of the first Zener diode DZ1, the first Zener diode DZ1 is turned on, and the first Zener voltage VDZ1 is applied to the first node N1, turning on the first low-voltage transistor LVMN1. However, if the voltage at the first node N1 increases excessively and exceeds the breakdown voltage of the first low-voltage transistor LVMN1, the first low-voltage transistor LVMN1 may be damaged. To prevent this, if the voltage at the first node N1 exceeds the third Zener voltage VDZ3, the third Zener diode DZ3 is turned on, causing a current to flow through the external voltage input line, the first Zener diode DZ1, the first resistor R0, and the third Zener diode DZ3. Accordingly, the first low-voltage transistor LVMN1 operates stably within its breakdown condition.

When the second Zener diode DZ2 is turned on, the sensed external voltage VINLVOVP at the second node N2 is consistently clamped to the second Zener voltage VDZ2 through an operation of the clamp circuit, consisting of the fourth resistor R3 and the second Zener diode DZ2. Thus, even if a high voltage is applied to the external voltage input line, low-voltage devices (e.g., transistors or components) included in the PMIC 100 operate stably at the second Zener voltage VDZ2. Since a voltage exceeding the threshold voltage VTH of the first low-voltage transistor LVMN1 is applied to the first node N1, the first low-voltage transistor LVMN1 is turned on, so that the third node N3 becomes logic low. Consequently, the fourth node N4 becomes logic high due to the inversion of the level of the third node N3, and the fifth node N5 becomes logic low due to the inversion of the level of the fourth node N4. Therefore, the second low-voltage transistor LVMN2 is turned on, and the third low-voltage transistor LVMN3 and the high-voltage sensing transistor HVMN1 are turned off. The fourth low-voltage transistor LVMP1 is turned on as the external voltage VINLV within the second clamp range is applied to the sixth node N6, and the internal output transistor LVMP2 is turned off as the seventh node N7 becomes logic high due to the fourth low-voltage transistor LVMP1.

The first and second high-voltage clamp transistors HVMN21 and HVMN22 operate as switches to supply the internal output voltage VINLVINT within the second clamp range. For example, at the external voltage VINLV within the second clamp range, the fifth Zener diode DZ5 is additionally turned on in the second overvoltage clamp mode "Overvoltage clamp mode 2". Even if the second high-voltage clamp transistor HVMN22 is turned on, the breakdown voltage of the internal output transistor LVMP2 or the low-voltage device "LV Device" may be reached first if the external voltage VINLV within the second clamp range is applied. Thus, by turning on both the fourth and fifth Zener diodes DZ4 and DZ5, the external voltage VINLV is used to generate the internal output voltage VINLVINT based on the resistance of the ninth resistor R8. The ninth resistor R8 may have almost the same resistance as the tenth resistor R9. Consequently, the second high-voltage clamp transistor HVMN22 may mirror and output the voltage divided between the ninth and tenth resistors R8 and R9 as the internal output voltage VINLVINT. As a result of the voltage division between the ninth and tenth resistors R8 and R9, the level of the internal output voltage VINLVINT may be half the level of the external voltage VINLV.

For example, in the PMIC 100, even if the internal output transistor LVMP2 is turned off, the fourth and fifth Zener diodes DZ4 and DZ5 are turned on or off based on the level of the external voltage VINLV, and the first and second high-voltage clamp transistors HVMN21 and HVMN22 are turned on. As a result, the external voltage VINLV is divided by the ninth and tenth resistors R8 and R9, enabling a clamp voltage proportional to the change in the external voltage VINLV to be output as the internal output voltage VINLVINT.

FIG. 14 is a table showing breakdown conditions for the components included in the PMIC 100, according to some embodiments of the present disclosure.

The first, second, third, fourth, and fifth Zener diodes DZ1, DZ2, DZ3, DZ4, and DZ5 included in the PMIC 100 may have the same Zener voltage.

The first, second, third, and fourth low-voltage transistors LVMN1, LVMN2, LVMN3, and LVMP1 and the internal output transistor LVMP2 may be low-voltage devices, and the breakdown conditions for the first, second, third, and fourth low-voltage transistors LVMN1, LVMN2, LVMN3, and LVMP1 and the internal output transistor LVMP2 having connections therebetween as illustrated in FIG. 3 will hereinafter be described.

FIG. 14 shows the minimum required breakdown voltage for each component of the PMIC 100. In some embodiments, negative voltages may be mathematically derived based on the conditions for the external voltage VINLV, and such negative voltages are considered as 0V. Referring to FIG. 14, for the first low-voltage transistor LVMN1, a maximum gate-source voltage "Max VGS" is the third Zener voltage VDZ3 of the third Zener diode DZ3, and a maximum drain-source voltage "Max VDS" is the second Zener voltage VDZ2 of the second Zener diode DZ2. The breakdown condition for the first low-voltage transistor LVMN1 is that a breakdown voltage LVBV of the first low-voltage transistor LVMN1 be higher than the first Zener voltage VDZ1 of the first Zener diode DZ1.

For the second low-voltage transistor LVMN2, a maximum gate-source voltage "Max VGS" is the threshold voltage VTH of low-voltage transistors, and a maximum drain-source voltage "Max VDS" is the voltage obtained by subtracting twice the second Zener voltage VDZ2 from the external voltage VINLV, i.e., (VINLV–2*VDZ2). The breakdown condition for the second low-voltage transistor LVMN2 is that a breakdown voltage LVBV of the second low-voltage transistor LVMN2 is lower than (VINLV–2*VDZ2). For example, the breakdown condition for the second low-voltage transistor LVMN2 may be met if a drain-source breakdown voltage VDS_BV2 of the second low-voltage transistor LVMN2 be lower than (VINLV–2*VDZ2), i.e., VDS_BV2<VINLV–2*VDZ2. In other words, the maximum level of the external voltage VINLV when using a particular component can be defined.

For the third low-voltage transistor LVMN3 in the PMIC 100, a maximum gate-source voltage "Max VGS" is the second Zener voltage VDZ2, and a maximum drain-source voltage "Max VDS" is the third Zener voltage VDZ3. The breakdown condition for the third low-voltage transistor LVMN3 is that a breakdown voltage LVBV of the third low-voltage transistor LVMN3 is higher than the third Zener voltage VDZ3.

For the fourth low-voltage transistor LVMP1, a maximum gate-source voltage "Max VGS" is a voltage obtained by subtracting the threshold voltage VTH from the second Zener voltage VDZ2, i.e., (VDZ2–VTH), and a maximum drain-source voltage "Max VDS" is the sum of the first Zener voltage VDZ1 and the threshold voltage VTH. The breakdown condition for the fourth low-voltage transistor LVMP1 is that a breakdown voltage LVBV of the fourth low-voltage transistor LVMP1 be higher than the sum of the first Zener voltage VDZ1 and the threshold voltage VTH.

For the internal output transistor LVMP2, a maximum gate-source voltage "Max VGS" is the sum of the first Zener voltage VDZ1 of the first Zener diode DZ1 and the threshold voltage VTH, and a maximum drain-source voltage "Max VDS" is also the sum of the first Zener voltage VDZ1 and the threshold voltage VTH. The breakdown condition for the internal output transistor LVMP2 is that a breakdown voltage LVBV of the internal output transistor LVMP2 be higher than the sum of the Zener voltage VDZ and the threshold voltage VTH.

The high-voltage sensing transistor HVMN1 and the first and second high-voltage clamp transistors HVMN21 and HVMN22 (hereinafter referred to collectively as "the high-voltage clamp transistors HVMN2") have a breakdown condition that allows them to withstand higher voltages than the first, second, third, and fourth low-voltage transistors LVMN1, LVMN2, LVMN3, and LVMP1.

For example, for the high-voltage sensing transistor HVMN1, a maximum gate-source voltage "Max VGS" is the second Zener voltage VDZ2, and a maximum drain-source voltage "Max VDS" is the external voltage VINLV. The breakdown condition for the high-voltage sensing transistor HVMN1 is that a breakdown voltage HVBV of the high-voltage sensing transistor HVMN1 be higher than a target external voltage VINLV to be protected.

For the high-voltage clamp transistors HVMN2, a maximum gate-source voltage "Max VGS" is the threshold voltage VTH of high-voltage transistors HVMN2, and a maximum drain-source voltage "Max VDS" is the voltage (VINLV-VDZ5) obtained by subtracting the fifth Zener voltage VDZ5 from the external voltage VINLV. The breakdown condition for the high-voltage clamp transistors HVMN2 is that a breakdown voltage HVBV of the high-voltage clamp transistors HVMN2 be higher than the voltage obtained by subtracting the fourth or fifth Zener voltage VDZ4 or VDZ5 from the external voltage VINLV.

The resistance of the first resistor R0 may be much less than the combined resistance of the second and third resistors R1 and R2 (i.e., R0<<R1+R2), and the resistance of the sixth resistor R5 may be almost equal to the resistance of the seventh resistor R6 (i.e., R5≈R6). The resistance of the eleventh resistor R10 may be much greater than the resistances of the ninth and tenth resistors R8 and R9, which are almost equal (i.e., R10»R9≈R8). If the resistances of the sixth and seventh resistors R5 and R6 are almost equal (i.e., R5≈R6), breakdown voltage protection can be provided for the fourth low-voltage transistor LVMP1 through the operation of an inverting amplifier consisting of the second low-voltage transistor LVMN2 and the sixth resistor R5, without a requirement of an additional gate breakdown voltage protection circuit.

Figure 15:
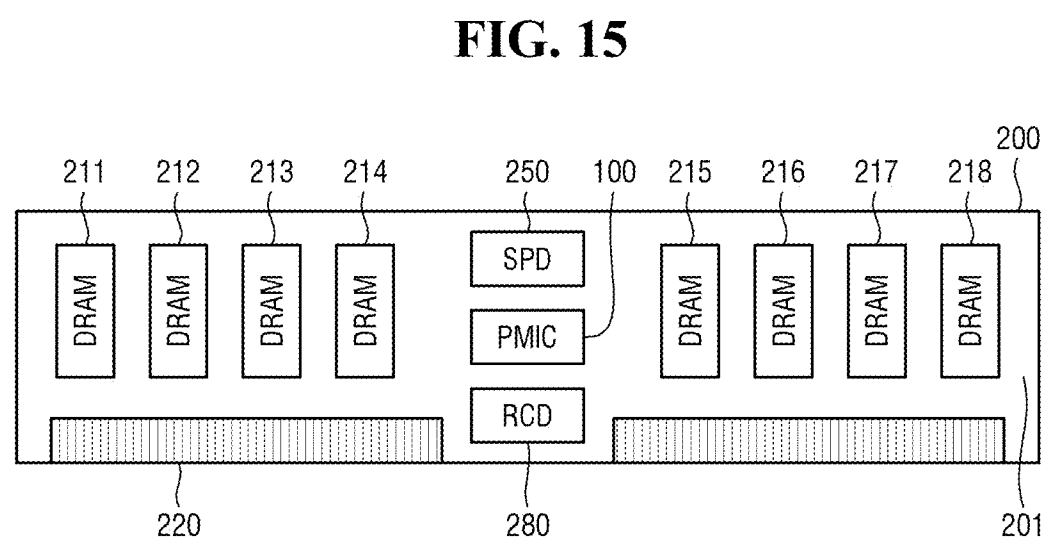

FIG. 15 illustrates a memory module including the PMIC 100, according to some embodiments of the present disclosure.

Referring to FIG. 15, the PMIC 100 may be included in a memory module 200 that may be installed in an electronic device. At least one memory module 200 may be installed in an electronic device.

The memory module 200 may include a plurality of volatile memory devices 211 through 218, driver circuits, the PMIC 100, and memory input/output pins 220, which are all disposed on a substrate 201. The driver circuits may include, for example, a serial presence detection (SPD) chip 250 and a registering clock driver (RCD) 280.

In some embodiments, the volatile memory devices 211 through 218 may be dynamic random-access memory (DRAM) devices, static random-access memory (SRAM) devices, and/or synchronous DRAM (SDRAM) devices. In some embodiments, the memory module 200 may further include data buffers (not illustrated) for data communication, and the data buffers are synchronized with data strobe signals DQS to exchange data DQ with a memory controller (not illustrated).

In some embodiments, the memory controller may communicate with the volatile memory devices 211 through 218 using the following memory module standards: Dual In-line Memory Module (DIMM), Registered DIMM (RDIMM), Load Reduced LRDIMM (LRDIMM), or Unbuffered DIMM (UDIMM).

The RCD 280 may control the volatile memory devices 211 to 218 and the PMIC 100 under the control of the memory controller. For example, the RCD 500 may receive addresses ADDR, commands CMD, a reset signal RST, and a clock signal CK from the memory controller. The RCD 500 may control the volatile memory devices 211 through 218 with a first control signal and the PMIC 100 with a second control signal.

In response to the received signals, the RCD 280 may control the volatile memory devices 211 through 218 to ensure data received through data signals DQ and the data strobe signals DQS are written to the volatile memory devices 211 through 218 or data are retrieved from the volatile memory devices 211 through 218.

The SPD chip 250 may be an electrically erasable programmable read-only memory (EEPROM). The SPD chip 250 may include initial or device information DI of the memory module 200. For example, the SPD chip 250 may include initial or device information DI such as the form, configuration, storage capacity, type, and operating environment of the memory module 200.

When a memory system including memory module 200 is booted, a host device (not shown) may read the device information DI from the SPD chip 250 and may recognize the memory module 200 based on the read information.

The PMIC 100 may generate an internal output voltage VINLVINT based on an external voltage VINLV and provide the internal output voltage VINLVINT to the driver circuits and/or each of the plurality of volatile memory devices 211 through 218. The driver circuits and each of the plurality of volatile memory devices 211 through 218 may operate protectively based on the internal output voltage VINLVINT. The external voltage VINLV may be provided to the external voltage input line of the PMIC 100 by the host device. For example, the host device may provide the external voltage VINLV to the external voltage input line of the PMIC 100 through at least one of the memory input/output pins 220. As described earlier with reference to FIGS. 1 through 14, the PMIC 100 may operate in various modes such as the normal mode, the overvoltage sensing mode, the first overvoltage clamp mode, and the second overvoltage clamp mode, depending on the level of the external voltage VINLV.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure as set forth in the following claims. Therefore, it should be understood that the embodiments set forth herein are illustrative in all respects and not limiting.

What is claimed is:

1. A power management integrated circuit (PMIC) comprising:
an internal output transistor connected to an external voltage input line, to which an external voltage is supplied, and configured to output an internal output voltage;
a self-overvoltage protection circuit configured to:
detect whether the external voltage exceeds a breakdown condition for the internal output transistor, and
provide a gate voltage to a gate terminal of the internal output transistor; and
a clamp circuit configured to output, as the internal output voltage:
a first clamp voltage having a uniform level in a first overvoltage clamp mode, and
a second clamp voltage, which is leveled down from the external voltage, in a second overvoltage clamp mode,
wherein when the internal output transistor is turned off, the PMIC is configured such that the clamp circuit outputs the internal output voltage, and
wherein a level of the external voltage in the second overvoltage clamp mode is greater than a level of the external voltage in the first overvoltage clamp mode.

2. The PMIC of claim 1, wherein the self-overvoltage protection circuit includes:
a first Zener diode and a first resistor, which are connected in series between the external voltage input line and a first node,
second and third resistors, which are connected in series between the first node and a ground voltage line,
a fourth resistor connected between the external voltage input line and a second node, and configured to convert the external voltage into a sensed external voltage, and
a second Zener diode connected between the second node and the ground voltage line, and
wherein a sum of resistances of the second and third resistors is greater than a resistance of the first resistor.

3. The PMIC of claim 2, wherein the self-overvoltage protection circuit further includes:
a fifth resistor connected between the second node and a third node,
a first low-voltage transistor connected between the third node and the ground voltage line, a first inverter configured to invert a signal from the third node and output the inverted signal from the third node to a fourth node, and a second inverter configured to invert a signal from the fourth node and output the inverted signal from the fourth node to a fifth node.

4. The PMIC of claim 3, wherein the self-overvoltage protection circuit further includes:

a sixth resistor having a first end and a second end connected to the ground voltage line, a seventh resistor connected between the external voltage input line and a sixth node, a second low-voltage transistor connected between the sixth node and the first end of the sixth resistor, and including a gate terminal connected to the fourth node, and a third low-voltage transistor connected between the ground voltage line and a common node of the second and third resistors, and including a gate terminal connected to the fifth node.

5. The PMIC of claim 4, wherein the self-overvoltage protection circuit further includes:

a fourth low-voltage transistor connected between the external voltage input line and a seventh node, and including a gate terminal connected to the sixth node, an eighth resistor connected between the external voltage input line and the seventh node, and a high-voltage sensing transistor connected between the seventh node and the ground voltage line, and including a gate terminal connected to the fifth node, and wherein the gate terminal of the internal output transistor is connected to the seventh node.

6. The PMIC of claim 1, wherein the clamp circuit further includes:

a fifth Zener diode, a tenth resistor, a first high-voltage clamp transistor, a ninth resistor, and a fourth Zener diode, which are connected in series between the external voltage input line and a ground voltage line, an eleventh resistor connected between the external voltage input line and a drain terminal of the first high-voltage clamp transistor, and a second high-voltage clamp transistor connected between the external voltage input line and an eighth node configured to output the internal output voltage, and wherein a gate terminal and the drain terminal of the first high-voltage clamp transistor and a gate terminal of the second high-voltage clamp transistor are connected to a ninth node.

7. A power management integrated circuit (PMIC) comprising:

an internal output transistor including a source terminal connected to an external voltage input line, to which an external voltage is supplied, and configured to output an internal output voltage to a voltage supply terminal of an external device in a normal mode and an overvoltage sensing mode;

a self-overvoltage protection circuit configured to:

turn on the internal output transistor in the overvoltage sensing mode, and turn off the internal output transistor in a clamp mode; and a clamp circuit including first and second high-voltage clamp transistors, which are connected to each other via a current mirror, and configured to output a clamp voltage as the internal output voltage, which is generated from the second high-voltage clamp transistor to the external device, in the clamp mode, wherein when the external voltage becomes higher than a first voltage, the PMIC is configured such that the self-overvoltage protection circuit turns on the internal output transistor, and wherein when the external voltage becomes higher than a second voltage greater than the first voltage, the PMIC is configured such that the self-overvoltage protection circuit turns off the internal output transistor.

8. The PMIC of claim 7, wherein the self-overvoltage protection circuit includes:

a first Zener diode and first, second, and third resistors, which are connected in series between the external voltage input line and a ground voltage line, a fourth resistor and a second Zener diode, which are connected in series between the external voltage input line and the ground voltage line, a third Zener diode connected between the ground voltage line and a first node that is a common node of the first and second resistors, and a first low-voltage transistor including a gate terminal connected to the first node.

9. The PMIC of claim 8, wherein the self-overvoltage protection circuit further includes:

a fifth resistor connected between a second node that is a common node of the fourth resistor and the second Zener diode and a third node to which a drain terminal of the first low-voltage transistor is connected, a first inverter supplied with a power from the second node, configured to invert a signal from the third node, and to output the inverted signal from the third node to a fourth node, a second inverter supplied with a power from the second node, configured to invert a signal from the fourth node, and to output the inverted signal from the fourth node to a fifth node, and a seventh resistor, a second low-voltage transistor, and a sixth resistor, which are connected in series between the external voltage input line and the ground voltage line, wherein a gate terminal of the second low-voltage transistor is connected to the fourth node.

10. The PMIC of claim 9, wherein the self-overvoltage protection circuit further includes:

a third low-voltage transistor connected between the ground voltage line and a common node of the second and third resistors, and including a gate terminal connected to the fifth node, a fourth low-voltage transistor connected between the external voltage input line and a seventh node, the fourth low-voltage transistor including a gate terminal connected to a sixth node that is a common node of the seventh resistor and the second low-voltage transistor, and a high-voltage sensing transistor connected between the seventh node and the ground voltage line, and including a gate terminal connected to the fifth node.

11. The PMIC of claim 10, further comprising:

an eighth resistor connected between the external voltage input line and the seventh node, wherein a gate terminal of the internal output transistor is connected to the seventh node, and wherein the internal output transistor is configured to turn on or turn off based on a level of the external voltage.

12. The PMIC of claim 10, wherein the first to third Zener diodes are configured to turn on in response to first to third Zener voltages, respectively, and wherein when the external voltage becomes higher than the second voltage, the PMIC is configured such that the high-voltage sensing transistor and the internal output transistor are turned off and the first and fourth low-voltage transistors are turned on, in the clamp mode.

13. The PMIC of claim 8, wherein the first to third Zener diodes are configured to turn on in response to first to third Zener voltages, respectively, and wherein the first voltage is identical to each of the first to third Zener voltages.

14. The PMIC of claim 8, wherein a resistance of the first resistor is smaller than a resistance of sum of a resistance of the second resistor and a resistance of the third resistor.

15. The PMIC of claim 8, wherein the first to third Zener diodes are configured to turn on in response to first to third Zener voltages, respectively, and wherein when the external voltage is higher than the first Zener voltage of the first Zener diode and a sensed external voltage from the fourth resistor is higher than a second Zener voltage of the second Zener diode, the PMIC is configured such that the self-overvoltage protection circuit outputs the internal output voltage according to the external voltage by turning on the first and second Zener diodes and the internal output transistor, and turning off the third Zener diode, in the overvoltage sensing mode.

16. The PMIC of claim 15, wherein in the overvoltage sensing mode, the first high-voltage clamp transistor and second high-voltage clamp transistor are configured to be turned off.

17. The PMIC of claim 8, wherein the clamp circuit further includes:

a fourth Zener diode and a ninth resistor, which are connected in series between the ground voltage line and a source terminal of the first high-voltage clamp transistor, a fifth Zener diode and a tenth resistor, which are connected in series between the external voltage input line and a drain terminal of the first high-voltage clamp transistor, and an eleventh resistor connected between the external voltage input line and the drain terminal of the first high-voltage clamp transistor, wherein the clamp circuit is configured to output the clamp voltage to the external device based on a state of the first high-voltage clamp transistor.

18. The PMIC of claim 17, wherein a resistance of the ninth resistor is identical to a resistance of the tenth resistor, and wherein a resistance of the eleventh resistor is greater than the resistance of the ninth resistor and the resistance of the tenth resistor.

19. The PMIC of claim 17, wherein the clamp mode includes a first overvoltage clamp mode and a second overvoltage clamp mode, wherein the fourth Zener diode is configured to be turned on and the fifth Zener diode is configured to be turned off, in the first overvoltage clamp mode, and wherein the fourth and fifth Zener diodes are configured to be both turned on in the second overvoltage clamp mode.

20. A memory module comprising:

memory input/output pins;

a plurality of memory devices; and a power management integrated circuit (PMIC) configured to:

receive an external voltage at an external voltage input line through at least one of the memory input/output pins, and output an internal output voltage to the plurality of memory devices, wherein the PMIC includes:

an internal output transistor configured to turn on in a normal mode and an overvoltage sensing mode and provide the internal output voltage, and a clamp circuit including first and second high-voltage clamp transistors connected to each other via a current mirror, and configured to output a clamp voltage as the internal output voltage generated from the second high-voltage clamp transistor, wherein when the internal output transistor is turned off, the memory module is configured such that the clamp circuit outputs the clamp voltage from the second high-voltage clamp transistor.

* * * * *